US007371682B2

(12) United States Patent
Gotoh et al.

(10) Patent No.: US 7,371,682 B2
(45) Date of Patent: May 13, 2008

(54) PRODUCTION METHOD FOR ELECTRONIC COMPONENT AND ELECTRONIC COMPONENT

(75) Inventors: Masashi Gotoh, Tokyo (JP); Hajime Kuwajima, Tokyo (JP); Hiroki Hara, Tokyo (JP); Hiroshi Yamamoto, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/559,334

(22) PCT Filed: Jun. 8, 2004

(86) PCT No.: PCT/JP2004/008298

§ 371 (c)(1),
(2), (4) Date: Dec. 5, 2005

(87) PCT Pub. No.: WO2004/112449

PCT Pub. Date: Dec. 23, 2004

(65) Prior Publication Data

US 2006/0128143 A1 Jun. 15, 2006

(30) Foreign Application Priority Data

Jun. 13, 2003 (JP) ............................. 2003-168824

(51) Int. Cl.
*H01L 21/302* (2006.01)
(52) U.S. Cl. ...................... 438/674; 438/675; 438/678; 438/687; 257/E21.586; 257/E21.597

(58) Field of Classification Search .................. 438/14, 438/15, 106, 107, 637–641, 597, 598, 602, 438/609, 618, 648, 650, 674, 678, FOR. 363, 438/FOR. 390, FOR. 405, FOR. 406, 599, 438/612, 687; 257/E21.479, E21.586, E21.174, 257/E21.175
See application file for complete search history.

(56) References Cited

U.S. PATENT DOCUMENTS 5,010,389 A * 4/1991 Gansauge et al. .......... 257/737
(Continued)

FOREIGN PATENT DOCUMENTS

JP           5-335713        12/1993
(Continued)

*Primary Examiner*—Fernando L. Toledo
*Assistant Examiner*—Quovaunda Jefferson
(74) *Attorney, Agent, or Firm*—Oblon, Spivak, McClelland, Maier & Neustadt, P.C.

(57) ABSTRACT

A method of manufacturing an electronic part in which on the upper surface of an insulating member covering lower layer wiring, a conductor portion connected from the lower layer wiring is exposed. In this method, electric power supplying film is formed on the upper surface of the insulating member, whereafter an opening portion having the lower layer wiring as a bottom is formed from the electric power supplying film side. Then metal plating is grown from the edge portion of the electric power supplying film from the opening portion with the electric power supplying film as an electrode, and the opening portion is filled with the metal plating closely contacting with the lower layer wiring to thereby form a conductor portion.

5 Claims, 10 Drawing Sheets

U.S. PATENT DOCUMENTS

| | | | |
|---|---|---|---|
| 5,855,993 A * | 1/1999 | Brady et al. | 428/209 |
| 6,316,830 B1 * | 11/2001 | Lin | 257/737 |
| 6,403,400 B2 * | 6/2002 | Lin | 438/121 |

FOREIGN PATENT DOCUMENTS

| | | |
|---|---|---|
| JP | 10-209644 | 8/1998 |
| JP | 11-017340 | 1/1999 |
| JP | 11-307938 | 11/1999 |
| JP | 11-343593 | 12/1999 |
| JP | 2001-217553 | 8/2001 |
| JP | 2002-151623 | 5/2002 |
| JP | 2002-223059 | 8/2002 |
| JP | 2003-110211 | 4/2003 |
| TW | 408190 | 10/2000 |

\* cited by examiner

PRODUCTION METHOD FOR ELECTRONIC COMPONENT AND ELECTRONIC COMPONENT

BACKGROUND OF THE INVENTION

1. Field of the Invention

This invention relates to a method of manufacturing an electronic part in which wiring layers are successively laminated on a core material, and an electronic part, and particularly to a method of manufacturing an electronic part which is suitable for forming an electrical conductor forming inter-layer connection in the wiring layers, and an electronic part.

2. Related Background Art

There is known an electronic part in which wiring layers are successively laminated on the surface of a core material, and connection is effected among these laminated wiring layers to thereby form stereoscopic wiring structure.

In the wiring layers, there have been proposed and disclosed various manufacturing methods for forming a conductor portion forming inter-layer connection. FIGS. 8A to 8D of the accompanying drawings are process illustrations showing the conventional manufacturing process of the wiring layer of an electronic part.

The wiring layer constituting the electronic part, as shown in FIG. 8A, has a base member 1 formed of an insulating material having a predetermined thickness, and lower layer wiring 2 formed on the back side of this base member 1 and in the interior of the base member 1.

To form a conductor portion 3 and upper layer wiring 4 (see FIG. 10 of the accompanying drawings for both) on the surface side of such a form of wiring layer, dry film 6 providing protective film is first attached to the surface side of the wiring layer on which copper foil 5 is generally formed. After the dry film 6 has been attached to the base member 1, as shown in FIG. 8B, exposure and a developing process are effected on the dry film 6 to thereby form an opening portion 7 in the formed area of the conductor portion 3. Thereafter, as shown in FIG. 8C, the copper foil exposed on the bottom surface of the opening portion 7 is removed by different etching to thereby expose the base member 1, and blast processing is effected on the surface of this exposed base member 1 to thereby expose the lower layer wiring 2 underlying the base member 1. FIG. 8D shows a state in which by the blast processing, the lower layer wiring 2 is exposed on the bottom surface of the opening portion 7.

Now, while in the above-described conventional example, aperture forming in the base member 1 is effected by blast processing, this method is not restrictive, but other method may also be used.

FIGS. 9A and 9B of the accompanying drawings are process illustrations showing the procedure of forming an opening portion by the use of laser working. FIG. 9A shows the state of a wiring layer before the laser working, and a laser working machine (not shown) for affecting the working of this wiring layer is disposed above this wiring layer.

By the use of a positioning mechanism provided in the laser working machine, a laser irradiating portion is moved to the predetermined forming position of the opening portion 7 to thereby individually effect the aperture forming work for the copper foil 5 and the base member 1. FIG. 9B shows the state after the opening portion 7 has been formed by laser working.

Usually, a YAG laser (yttrium aluminum garnet laser) is used for the above-described working of the copper foil 5, and a carbonic acid gas laser is used for the working of the base member 1 formed of insulating resin. These different lasers can be carried on one and the same positioning mechanism from the standpoint of an improvement in working efficiency so that continuous working (of the copper foil 5 and the base member 1) may be effected. Also, instead of the use of the YAG laser, only the copper foil may be subjected to patterning by etching.

After the opening portion 7 in which the lower layer wiring 2 is exposed on the surface of the wiring layer has been thus formed, this opening portion 7 is filled by a metal material to thereby form a conductor portion 3.

FIGS. 10A, 10B and 10C of the accompanying drawings are process illustrations showing the procedure of forming the conductor portion in the opening portion.

To form the conductor portion in the opening portion, as shown in FIG. 10A, electroless plating is first effected on the front side of the wiring layer in which the opening portion 7 is formed, with a view to improve the adhesiveness with the base member 1, to thereby form an electroless plating layer 8. After this electroless plating layer 8 has been formed, electroplating is effected with this electroless plating layer 8 as an electrode, and an electroplating layer 9 is precipitated on the upper layer of the electroless plating layer 8 so as to fill the opening portion 7. FIG. 10B shows the state after the electroplating layer 9 has been formed.

After the electroplating layer 9 has been thus formed, as shown in FIG. 10C, a conductor portion 3 and upper wiring 4 are formed on the copper foil 5, the electroless plating layer 8 and the electroplating layer 9 by the use of a subtractive method.

Now, while in the above-described conventional example, the electroless plating layer is used to improve the adhesiveness between the base member 1 and the conductor portion 3 (see, for example, Japanese Patent Application Laid-open No. H11-343593), there is also known a method of applying other processing in place of the electroless plating layer (see, for example, Japanese Patent Application Laid-open No. 2001-217553).

However, the use of the above-described electroless plating (and other method replacing the electroless plating) has posed such problems will be shown below.

When as shown in FIG. 10B, electroplating is effected to try to fill the opening portion 7 with a metal material after the electroless plating layer has been formed, the electroplating layer 9 is thickly formed on the whole of one side of the wiring layer and as the result, there has arisen the problem that when as shown in FIG. 10C, a wiring pattern is to be formed by etching, the cross section of this wiring pattern becomes trapezoid, and dimensional accuracy is reduced and a wiring pattern of a narrow width cannot be formed.

Also, when the electroless plating layer 8 is formed and electroplating is effected with this layer as an electrode, fresh plating liquid is more applied to the surface of this electroless plating layer 8 than to the inside of the aperture. Therefore, the growth of the electroplating layer 9 on this surface is promoted, and this has resulted in the possibility that before the opening portion 7 is filled with a metal material, the opening portion 7 is closed (by the electroplating layer 9) and a so-called void forms in the interior of the conductor portion 3.

Also, in a case where electroless plating is not used, but other ante-processing is effected, there has been the possibility that a similar problem may arise.

Now, when electroless plating is used, a metal catalyst is used to cause the plating to adhere also to other portion (insulator portion) than a conductor. However, if this metal catalyst is residual on the surface of a wiring layer, there has been the possibility that an insulation resistance value may be reduced or such trouble as the short-circuiting of a wiring pattern may be caused. In the electronic parts in recent years, a narrower pitch has been advanced and the possibility of the occurrence of the above-noted trouble has more increased.

SUMMARY OF THE INVENTION

In view of the above-noted problems peculiar to the prior art, the present invention has as its object to provide a method of manufacturing an electronic part in which electroless plating which is the ante-processing of electroplating, or other ante-processing corresponding thereto is disused to thereby make it possible to achieve the simplification of steps and also achieve an improvement in electrical reliance, and an electronic part.

The present invention has been made on the basis of the finding that if with copper foil formed in advance on a wiring layer as an electrode, electroplating layer is grown from the copper foil exposed from an end surface of an opening portion, a conductor portion can be formed without an electroless plating layer being used as an electrode.

That is, the method of manufacturing an electronic part according to the present invention is a method of manufacturing an electronic part in which on the upper surface of an insulating member covering lower layer wiring, a conductor portion connected from the lower layer wiring is exposed, comprising forming electric power supplying film on the upper surface of the insulating member, and thereafter forming an opening portion having the lower layer, wiring as a bottom from the electric power supplying film side, growing metal plating layer from an edge portion of the electric power supplying film from the opening portion with the electric power supplying film as an electrode, and filling the opening portion with the metal plating closely contacting with the lower layer wiring to thereby provide it as a conductor portion.

Here, after electric power supplying film and protective film have been formed on the upper surface of the insulating member in a thickness direction, an opening portion can be formed and metal plating can be grown from the electric power supplying film exposed from the opening portion.

More specifically, the method of manufacturing an electronic part according to the present invention is a method of manufacturing an electronic part in which on the upper surface of an insulating member covering lower layer wiring, a conductor portion connected from the lower layer wiring is exposed, comprising forming electric power supplying film and protective film on the upper surface of the insulating member, and thereafter forming an opening portion having the lower layer wiring as a bottom in the protective film and the electric power supplying film in the formed area of the conductor portion, growing metal plating layer from the electric power supplying film exposed from the opening portion with the electric power supplying film as an electrode, and after the metal plating layer has reached the lower layer wiring, and filling the opening portion with the metal plating closely contacting with the lower layer wiring, with the electric power supplying film and the lower layer wiring as electrodes, to thereby provide it as a conductor portion.

Instead of the formation of the electric power supplying film on the insulating member, use may be made of a method of making the insulating member into copper foil with insulating resin attached thereto, or superposing an adhesive sheet and metal foil corresponding to copper foil one upon the other, and forming a conductor portion by press.

The electronic part according to the present invention is an electronic part having structure in which upper layer wiring is formed on the upper surface of an insulating member covering lower layer wiring and also, the lower layer wiring and the upper layer wiring are connected together by a conductor portion extending through the insulating member, wherein the conductor portion forming the connection between the lower layer wiring and the upper layer wiring is formed by only the precipitation of a metal by electroplating.

According to the above-described construction, an etching process is first carried out from above the insulating member on which protective film is laminated. After the etching process has been carried out, the exposed insulating member is subjected to blast processing or laser working to thereby remove the insulating member, and the lower layer wiring underlying the insulating member is exposed to thereby form an opening portion.

After the opening portion has been thus formed, electroplating is effected with the electric power supplying film as an electrode, whereupon a metal precipitated by the plating grows particularly on the edge portion of the electric power supplying film in the opening portion by a current density concentrating effect. When the grown metal plating comes to the lower layer wiring exposed to the bottom surface of the opening portion, the lower layer wiring in addition to the end surface of the electric power supplying film, now acts as an electrode. Therefore, the metal plating grows not only from the end surface of the electric power supplying film as a starting point, but also from the lower layer wiring. When the growth of the metal plating with the end surface of the electric power supplying film and the lower layer wiring as the starting points continues, the inside of the opening portion is filled with the metal plating and a conductor portion is formed. After the conductor portion has been formed, the upper side of the conductor portion is polished to thereby obtain a preset height, whereafter patterning can be effected by a subtractive method or a semi-additive process. If such a procedure is carried out, electroless plating or other processing replacing it becomes unnecessary, and it becomes possible to form a conductor portion by only an electroplating process.

Also, the present invention can cope with even a case where a circuit pattern is already formed on a lower layer and electric power supply cannot be effected from the lower layer side. Also, the edge portion of the electric power supplying portion is utilized and therefore, the precipitation speed of the plating layer is high and further, after the growth of the plating layer, the plating layer is precipitated with the aforementioned edge portion and the bottom surface of the opening portion as electrodes and therefore, it becomes possible to improve the precipitation speed of the plating layer.

While in the above-described construction, for the convenience of construction, use has been made of the lower layer wiring and the conductor portion overlying this lower layer wiring, this upper and lower positional relationship is not restrictive, but of course, an electronic part manufactured by the above-described process may be used in such a manner that the conductor portion is the lower side and the lower layer wiring overlies the conductor portion.

DESCRIPTION OF THE PREFERRED EMBODIMENT

Figure 1:
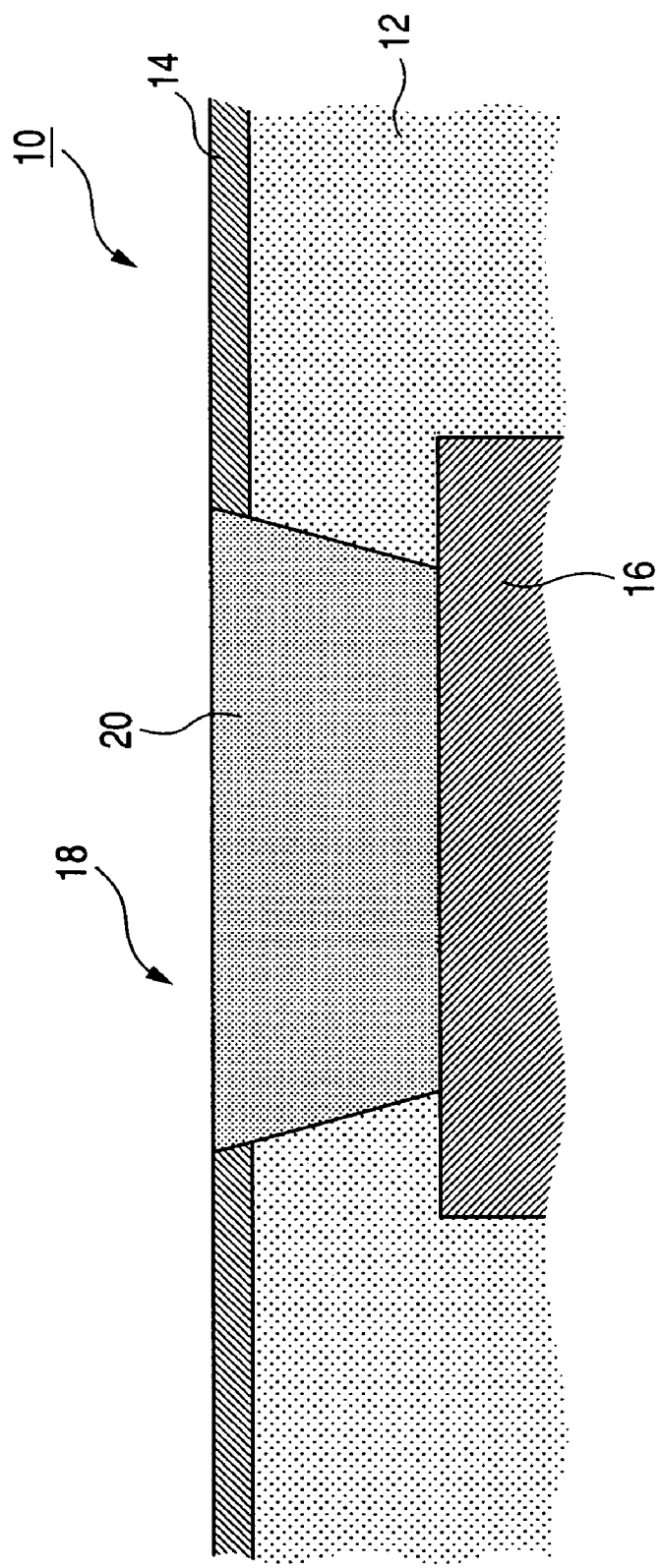
FIG. 1 is a cross-sectional view of essential portions showing a form immediately after a conductor portion has been formed in a wiring layer.

A method of manufacturing an electronic part according to the present invention, and an electronic part will hereinafter be described with respect to a preferred specific embodiment thereof shown in the drawings.

The electronic part according to the present embodiment is of a form in which wiring layers are successively laminated on the opposite sides of a core material. These laminated wiring layers are connected together to thereby form stereoscopic wiring structure.

FIG. 1 is a cross-sectional view of essential portions showing a form immediately after a conductor portion has been formed in a wiring layer.

As shown in FIG. 1, the wiring layer 10 constituting an electronic part according to the present embodiment has a base member 12 comprising an insulating member having a predetermined thickness, copper foil 14 uniformly formed on the upper surface of this base member 12, and a columnar conductor 16 providing lower layer wiring formed in the interior of the base member 12.

An opening portion 18 extending through the base member 12 and the copper foil 14 is formed above the columnar conductor 16, and a conductor portion 20 formed of a metal material is formed in the interior of this opening portion 18. Now, the conductor portion 20 forming electrical connection between the copper foil 14 which is the basis of upper layer wiring and the columnar conductor 16 has been formed by only electroplating without ante-processing, such as, for example, electroless plating being effected. Therefore, in the wiring layer 10 manufactured by a manufacturing method according to the present embodiment, the ante-processing step such as electroless plating becomes unnecessary when the conductor portion 20 is to be formed and thus, the shortening of the manufacturing process is achieved. Further, by the ante-processing step being made unnecessary, for example, a metal catalyst for causing plating to adhere also to other portion (insulator portion) than the electroless-plating-processed conductor can be prevented from being residual on the upper foil 14 side, and it becomes possible to improve the reliability of the electronic part.

The method of manufacturing the electronic part having such a feature will be shown below.

FIGS. 2A to 2D and FIGS. 3A to 3E are process illustrations showing the procedure of forming a conductor portion above the columnar conductor.

Figure 2A:
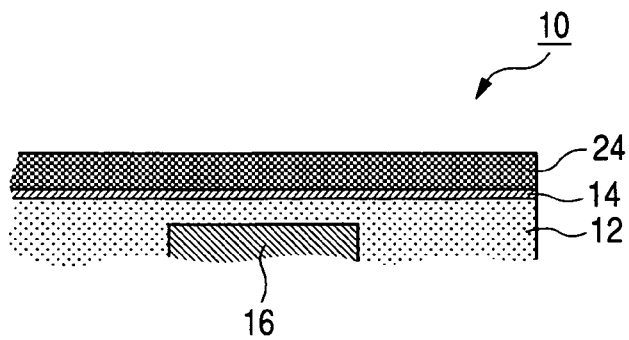
FIGS. 2A, 2B, 2C and 2D are process illustrations showing the procedure of forming a conductor portion above a pillar-shaped conductor.
Figure 2B:
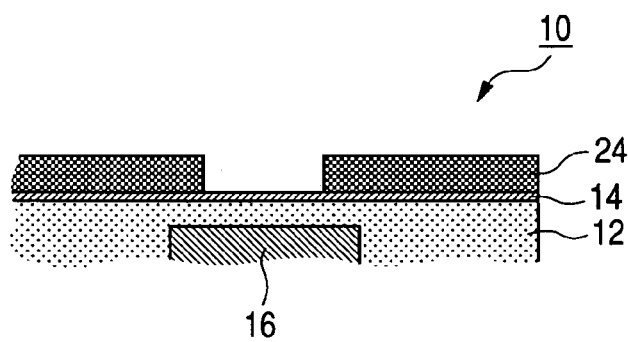

To form the conductor portion 20 above the columnar conductor 16 providing lower layer wiring, as shown in FIG. 2A, dry film (protective film) 24 is first attached to the upper surface of the copper foil 14 providing electric power supplying film. After this dry film 24 has been attached, as shown in FIG. 2B, photoetching is effected on the dry film 24 to thereby form an aperture corresponding to the edge portion of the opening portion 18 in an area wherein the opening portion 18 is to be formed.

Figure 2C:
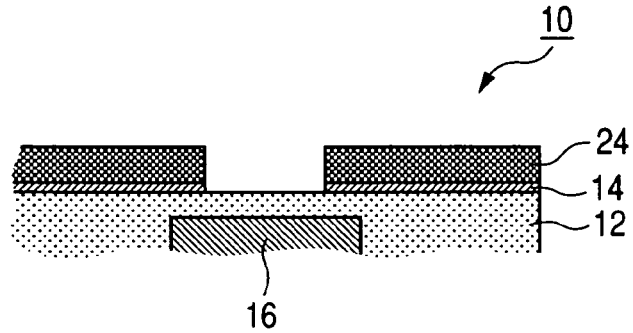

After the aperture corresponding to the edge portion of the opening portion 18 has been thus formed in the dry film 24, etching is effected on the copper foil 14 exposed under the dry film 24 to thereby remove this copper foil 14. FIG. 2C shows the state after the copper foil 14 has been removed by the etching.

Figure 2D:
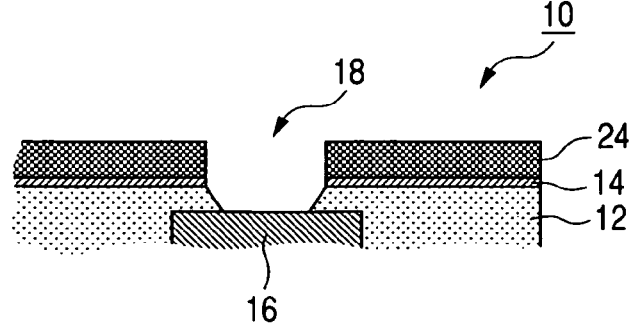

After the copper foil 14 has been removed by the etching to thereby expose the surface of the base member 12, as shown in FIG. 2D, blast processing is effected on this base member 12 to thereby remove the base member 12 overlying the columnar conductor 16, and expose the head of the columnar conductor 16.

While in the present embodiment, etching and blast processing are used to remove the copper foil 14 and the base member 12 which overlie the columnar conductor 16, this is not restrictive, but for example, by the use of a laser working machine, laser irradiation conforming to the copper foil 14 and the base member 12 may be effected to thereby remove these members (for example, a YAG laser may be used for the copper foil 14, and a carbonic acid gas laser may be used for the base member 12).

Figure 3A:
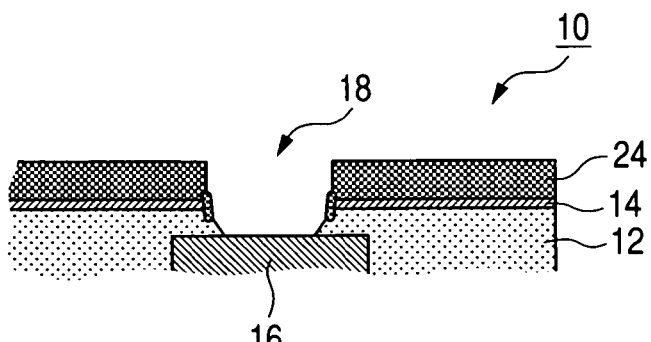
FIGS. 3A, 3B, 3C, 3D and 3E are process illustrations showing the procedure of forming the conductor portion above the pillar-shaped conductor.

After the opening portion 18 has been thus formed in the base member 12 by the above-described steps, as shown in FIG. 3A, electroplating is effected with the copper foil 14 as electric power supplying film (a so-called electrode). In the present embodiment, electroplating is effected while the dry film 24 used in the etching and the blast processing is left intactly, and this is for covering the surface of the copper foil 14 exposed to the upper surface with the dry film 24 to thereby precipitate a conductor by more positively utilizing the edge portion, in addition to the current density concentrating effect into the edge portion.

Here, on the inner wall surface of the opening portion 18, the end surface providing the edge portion of the copper foil 14 is exposed by etching (or by laser working) and therefore, when electroplating is effected with this copper foil 14 as electric power supplying film, a metal material 26 providing the basis of the conductor portion 20 is precipitated from the end surface of the copper foil 14, and this metal material 26 grows in the opening portion 18.

Figure 3B:
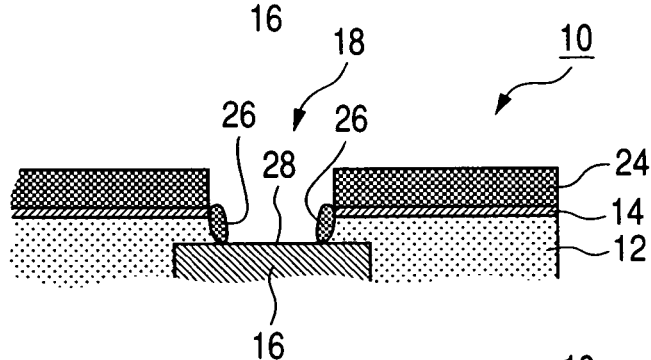

When the metal material 26 thus grows with the lapse of time, this metal material 26 reaches the upper surface of the columnar conductor 16. This state is shown in FIG. 3B.

Figure 3C:
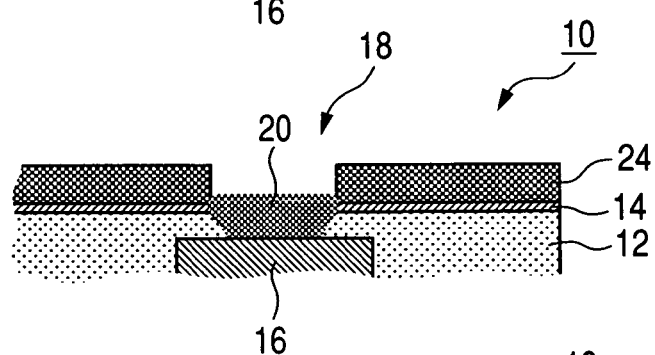

When the metal material 26 thus reaches the upper surface 28 of the columnar conductor 16, the copper foil 14 and the columnar conductor 16 are electrically connected together, and the upper surface 28 of the columnar conductor 16 also provides an electrode for plating precipitation, and the metal material 26 is also precipitated on the aforementioned upper surface 28, whereby a conductor portion 20 is formed. This state is shown in FIG. 3C.

Figure 3D:
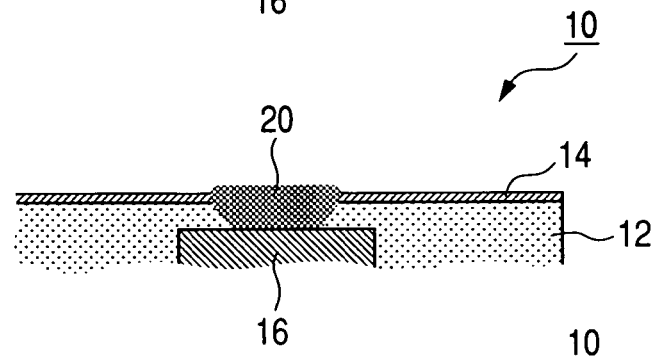
Figure 3E:
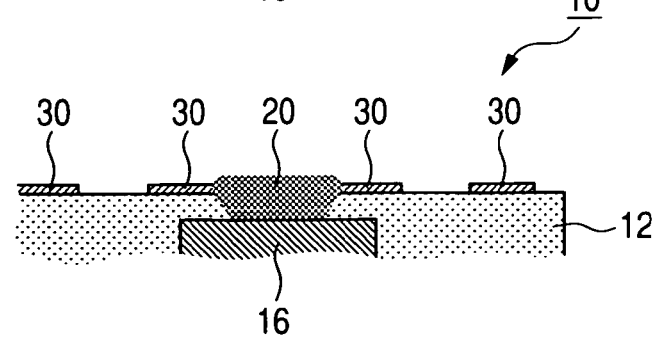

After the conductor portion 20 has been formed, the dry film 24 is removed as shown in FIG. 3D, whereafter as shown in FIG. 3E, patterning is effected on the copper foil 14 by the subtractive method or the semi-additive process, and upper layer wiring 30 can be formed from the copper foil 14. Also, it is necessary to uniformize the height of the conductor portion 20 formed by the above-mentioned electroplating to the height of the upper layer wiring 30, or to flatten the surface of the conductor portion 20, but regarding this, adjustment can be effected by polishing the upper surface of the conductor portion 20 to thereby uniformize the height thereof to the height of the upper layer wiring 30 after the conductor portion has been formed, or affecting the control of a timer, the control of the electric current (of electroplating) and the addition of an additive to plating liquid when the conductor portion 20 is to be formed.

In the wiring layer 10 wherein the columnar conductor 16 has already been thus formed, if the metal material 26 is grown in the opening portion 18 with the copper foil 14 before patterning as electric power supplying film, it becomes possible to apply charges even if there are a plurality of opening portions 18, and a plurality of conductor portions 20 can be formed. Also, if as described above, the wiring layer 10 is formed by the use of the manufacturing method according to the present embodiment, such an ante-step as electroless plating can be eliminated and therefore, the simplification of the manufacturing process by the elimination of the step becomes possible and the metal catalyst used for the electroless plating or the like becomes unnecessary, and the reliability of the wiring layer 10 and an electronic part formed with the wiring layer 10 laminated therein can be improved. The conductor portion 20 is firmly connected to the upper surface 28 of the columnar conductor 16 and the end surface of the upper layer wiring 30 and therefore, even if an extraneous force is applied to the wiring layer 10 itself, the conductor portion 20 can be prevented from coming off from the opening portion 18. Also, the surface of the copper foil 14 is covered with the dry film 24, whereby plating is not attached to the surface layer and therefore, even by the subtractive method, it becomes possible to make the rate at which the opening portion becomes trapezoid (that is, the rate of a tapered portion) small.

FIGS. 4A to 4D and FIGS. 5A to 5E are process illustrations showing the procedure of forming a conductor portion on the base member having wiring layers formed on the back and in the interior thereof.

It is to be understood that in the same process, description will be made with the same reference numerals given to common members in the above-described process.

If the manufacturing method according to the present embodiment is also used for the wiring layer 10 in which, as shown in these figures, patterning has also been formed on the back side of the base member 12, it becomes possible to form the conductor portion 20 exposed to the upper layer wiring 30 side by only electroplating.

Figure 4A:
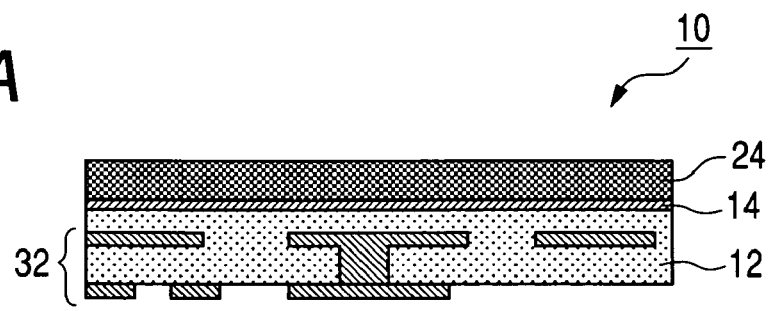
FIGS. 4A, 4B, 4C and 4D are process illustrations showing the procedure of forming a conductor portion on a base member having wiring layers formed on the back and in the interior thereof.
Figure 4B:
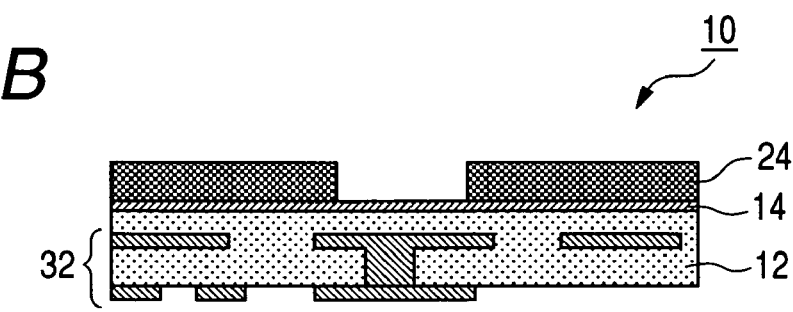
Figure 4C:
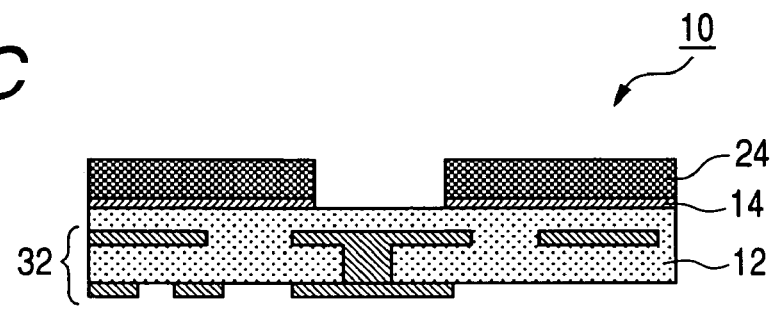
Figure 4D:
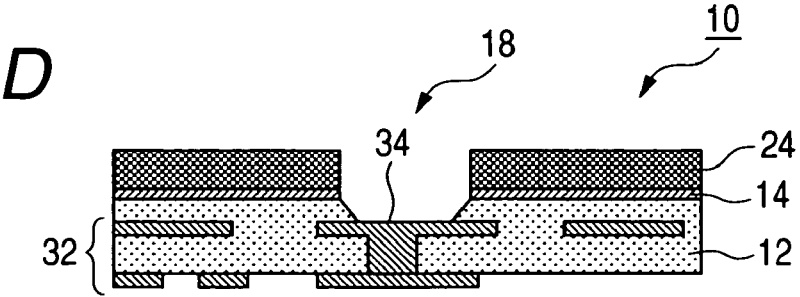
Figure 5A:
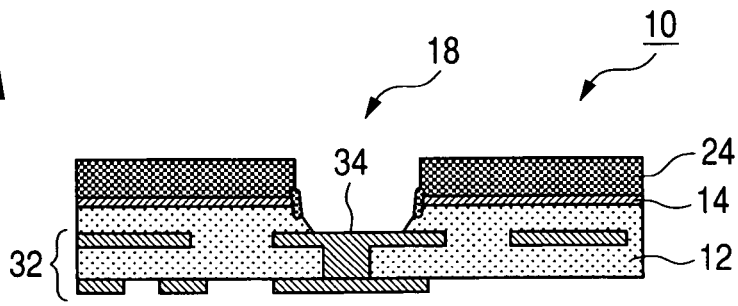
FIGS. 5A, 5B, 5C, 5D and 5E are process illustrations showing the procedure of forming the conductor portion on the base member having wiring layers formed on the back and in the interior thereof.
Figure 5B:
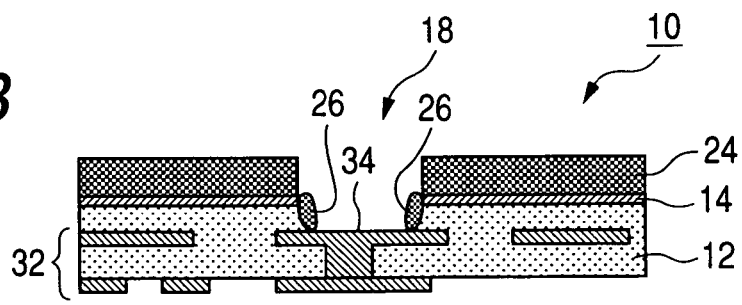
Figure 5C:
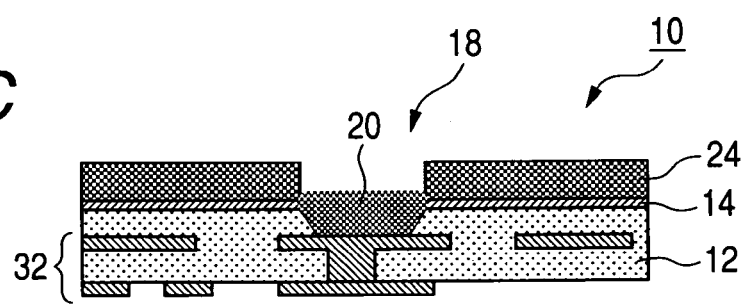

That is, as shown in FIG. 4A, the dry film 24 is attached to the upper-surface of the wiring layer 12, whereafter as shown in FIGS. 4B to 4D, etching on the dry film 24, etching on the copper foil 14 and blast processing on the base member 12 are effected to thereby form the opening portion 18 in the surface of the base member 12. Then, by the formation of the opening portion 18, lower layer wiring 32 to be connected is exposed to the bottom surface of the opening portion 18, whereafter as shown in FIG. 5A, the metal material 26 is precipitated in the opening portion 18 with the copper foil 14 as electric power supplying film, and it is grown after as shown in FIG. 5B, the metal material 26 has then reached the upper surface 34 of the lower layer wiring 32, the metal material 26 is grown with the end surface of the copper foil 14 and the upper surface 34 of the lower layer wiring 32 as electrodes, to thereby form the conductor portion 20. This state is shown in FIG. 5C.

Figure 5D:
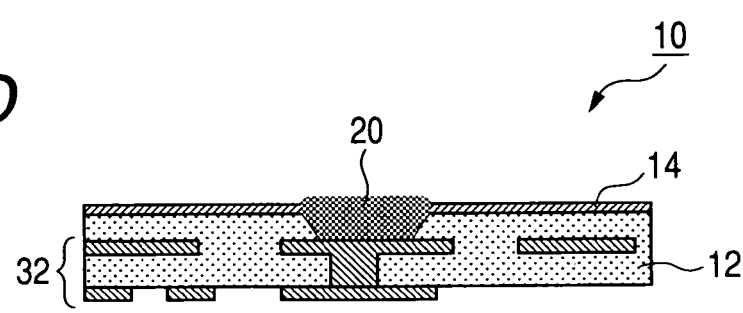
Figure 5E:
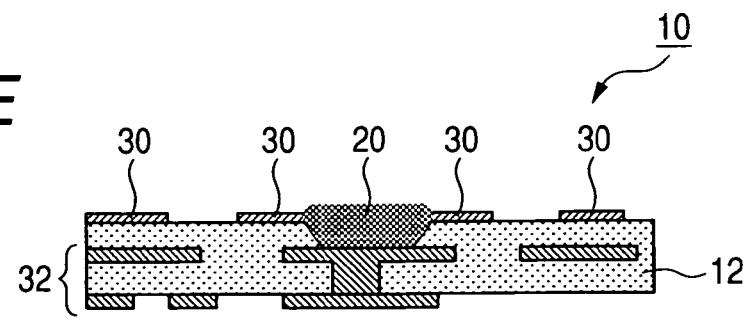

After the conductor portion 20 has been thus formed, the dry film 24 is removed as shown in FIG. 5D, whereafter as shown in FIG. 5E, patterning can be effected on the copper foil 14 to thereby form the upper layer wiring 30.

Even in a case where the wiring pattern has already been thus formed on the back side of the base member 12, and the lower layer wiring side cannot be used as an electrode, if the copper foil 14 providing the basis of the upper layer wiring 30 is used as electric power supplying film, the conductor portion 20 can be formed by only the electroplating step without the ante-processing step such as electroless plating being applied.

While in the present embodiment, from the standpoint of concentrating current density into the edge portion, electroplating is effected in a form in which the dry film is left on the surface of the copper foil, this form is not restrictive, but it is possible to achieve the present invention even if the dry film is not left on the surface of the copper foil.

FIGS. 6A to 6D and FIGS. 7A to 7E are process illustrations showing another procedure of forming a conductor portion above a pillar-shaped conductor. It is to be understood that description will be made with the same reference numerals given to members common to the method of forming the conductor portion already described with reference to FIGS. 2A to 2D and FIGS. 3A to 3E.

Figure 6A:
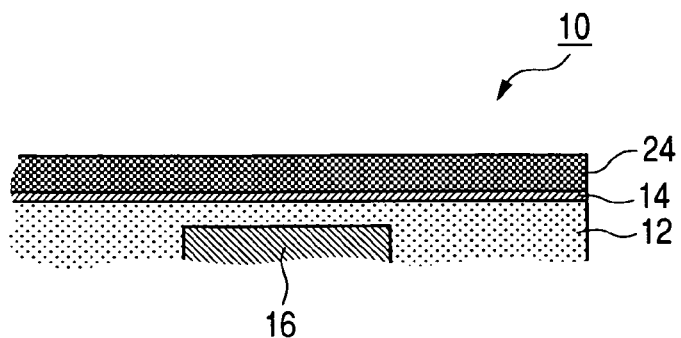
FIGS. 6A, 6B, 6C and 6D are process illustrations showing another procedure of forming a conductor portion above a pillar-shaped conductor.
Figure 6B:
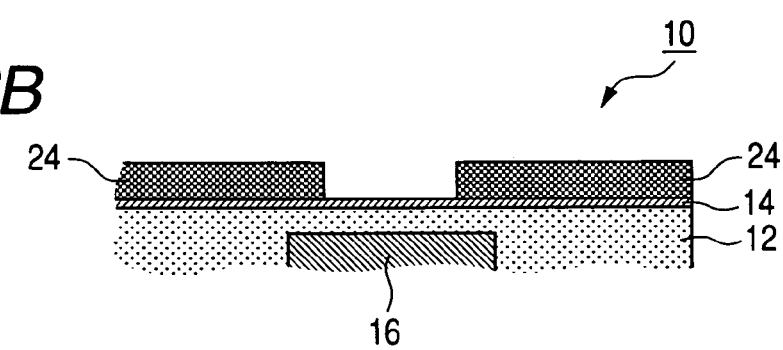

To form a conductor portion 20 above a columnar conductor 16 providing lower layer wiring, as shown in FIG. 6A, dry film (protective film) 24 is first attached to the upper surface of copper foil 14 providing electric power supplying film. After this dry film 24 has been attached, photoetching is effected on the dry film 24, as shown in FIG. 6B, to thereby form an aperture corresponding to the edge portion of an opening portion 18 in an area wherein the opening portion 18 is to be formed.

Figure 6C:
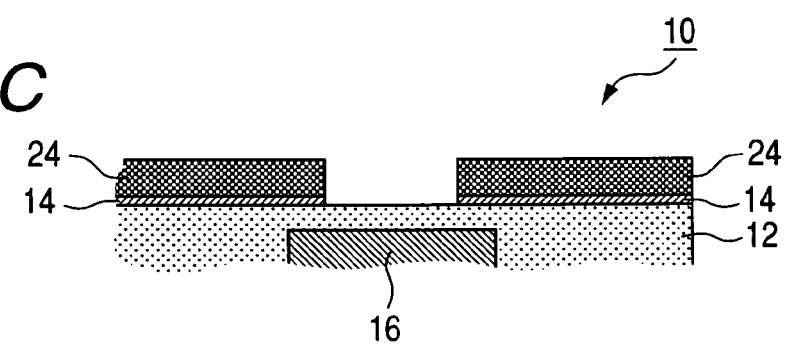

After the aperture corresponding to the edge portion of the opening portion 18 has been thus formed in the dry film 24, etching is effected on copper foil 14 exposed under the dry film 24 to thereby remove this copper foil 14. FIG. 6C shows the state after the copper foil 14 has been removed by the etching.

Figure 6D:
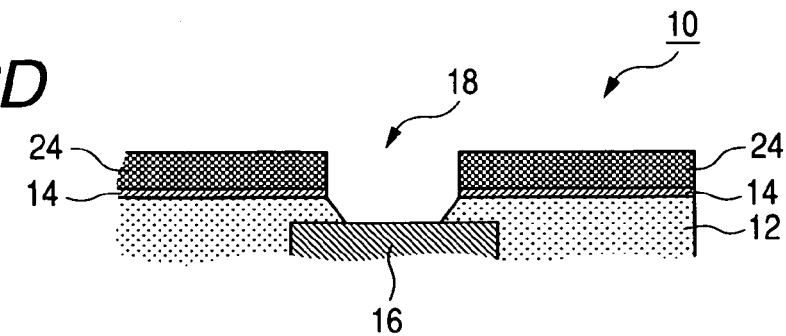

After the copper foil 14 has been removed by the etching to thereby expose the surface of a base member 12, blast processing is effected on this base member 12, as shown in FIG. 6D, to thereby remove the base member 12 overlying the columnar conductor 16 and expose the head of the columnar conductor 16.

Figure 7A:
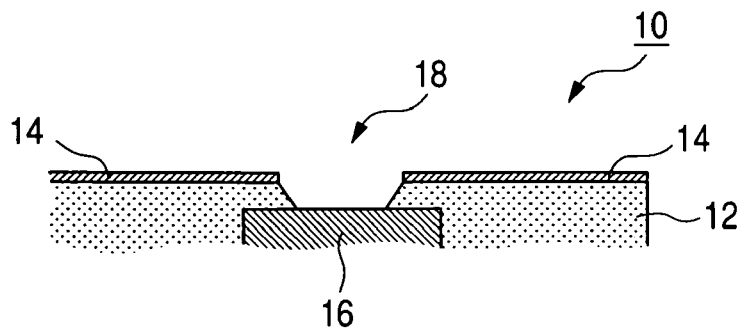
FIGS. 7A, 7B, 7C, 7D and 7E are process illustrations showing another procedure of forming a conductor portion above a pillar-shaped conductor.

After the opening portion 18 has been thus formed in the base member 12 by the above-described steps, as shown in FIG. 7A, the dry film 24 overlying the copper foil 14 is removed to thereby expose the copper foil 14.

Figure 7B:
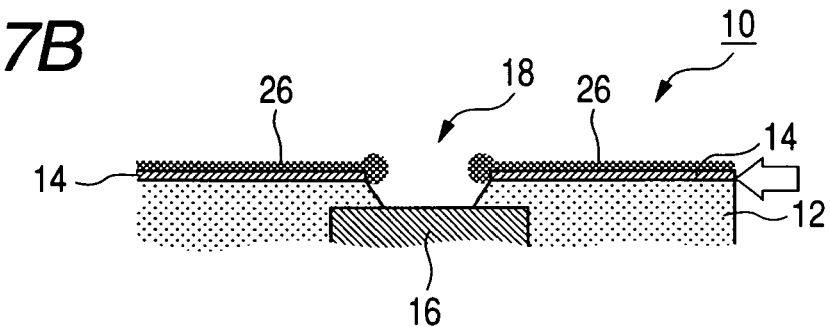

After the dry film 24 has been removed, electroplating is effected with the copper foil 14 as electric power supplying film (a so-called electrode) If the copper foil 14 having its surface thus exposed is used as the electric power supplying film, a metal material 26 is precipitated on that portion of the copper foil 14 which is exposed, but on the copper foil 14, current density concentrates more in the edge portion of the copper foil 14 than in the surface thereof and therefore, the growth of plating on the edge portion becomes quicker than on the surface portion. FIG. 7B shows the state in which the plating is progressing on the edge portion.

Figure 7C:
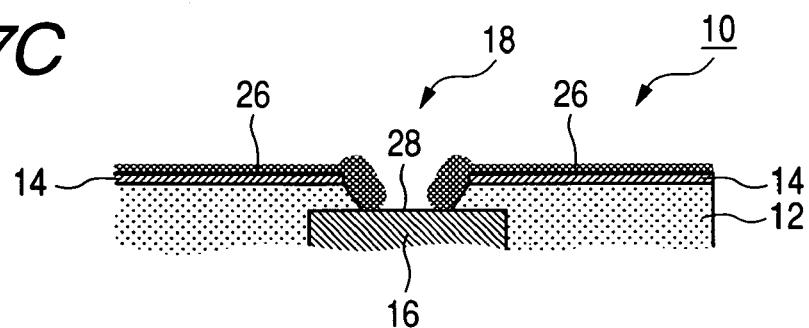
Figure 7D:
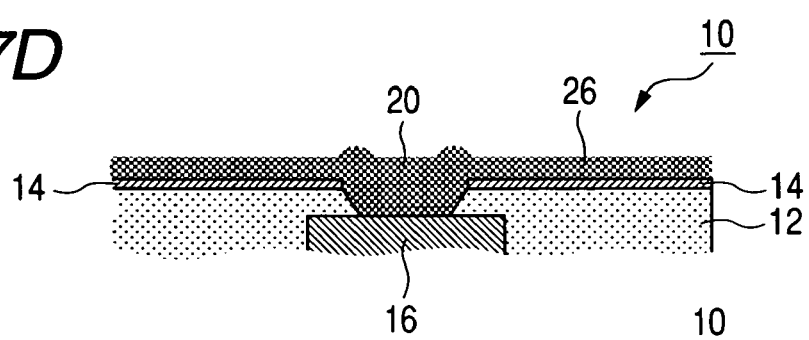

When from the state shown in FIG. 7B, the growth of the plating on the edge portion progresses with the lapse of time, the metal material 26 reaches the upper surface 28 of the columnar conductor 16, as shown in FIG. 7C. When the metal material 26 thus reaches the upper surface 28 of the columnar conductor 16, the copper foil 14 and the columnar conductor 16 are electrically connected together, and the upper surface 28 of the columnar conductor 16 also provides an electrode for precipitation, and the metal material 26 is also precipitated on the aforementioned upper surface 28, whereby a conductor portion 20 is formed. This state is shown in FIG. 7D.

Figure 7E:
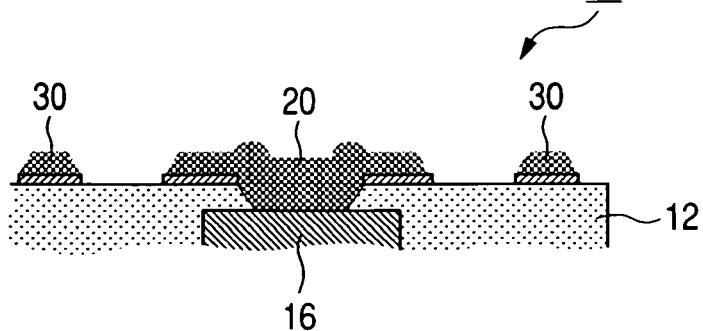
Figure 8A:
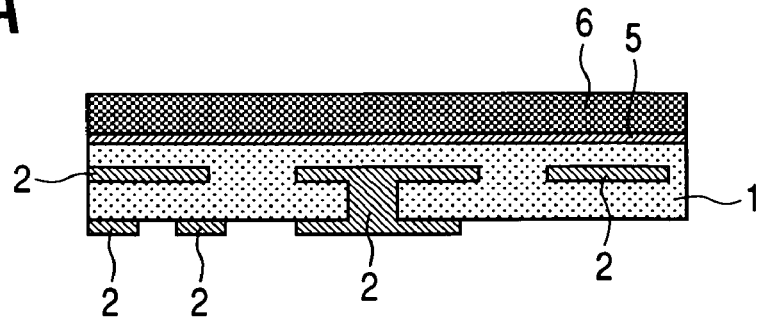
FIGS. 8A, 8B, 8C and 8D are process illustrations showing the manufacturing process of a conventional wiring layer in an electronic part.
Figure 8B:
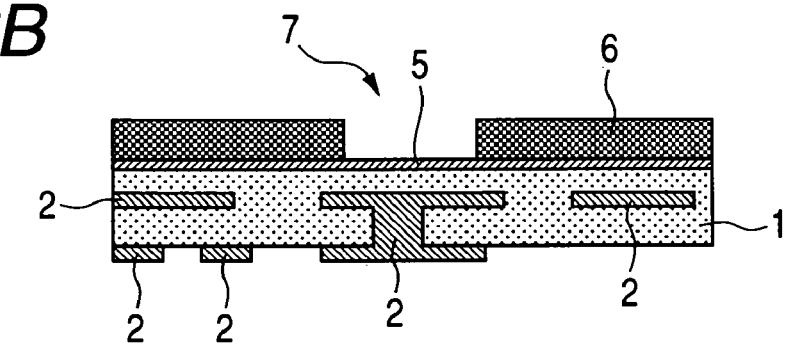
Figure 8C:
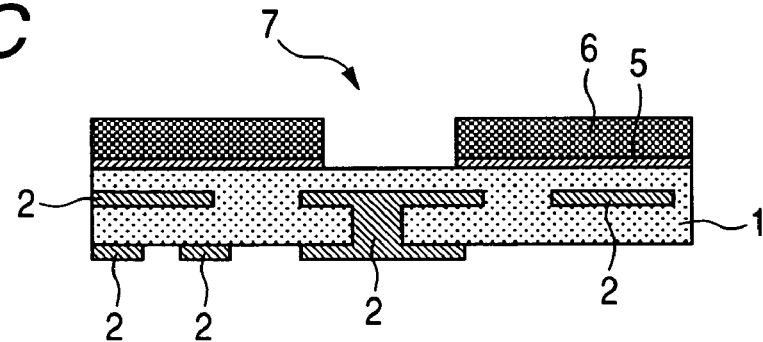
Figure 8D:
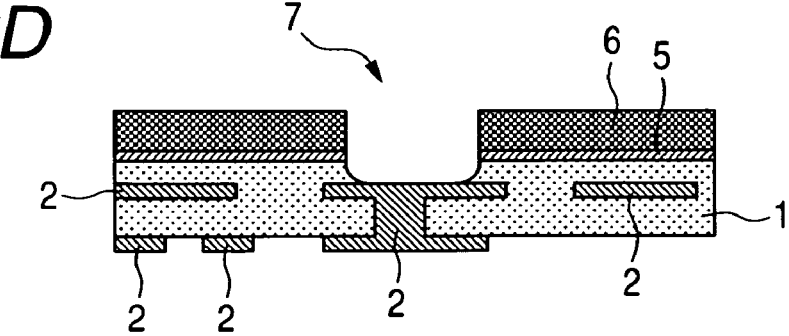
Figure 9A:
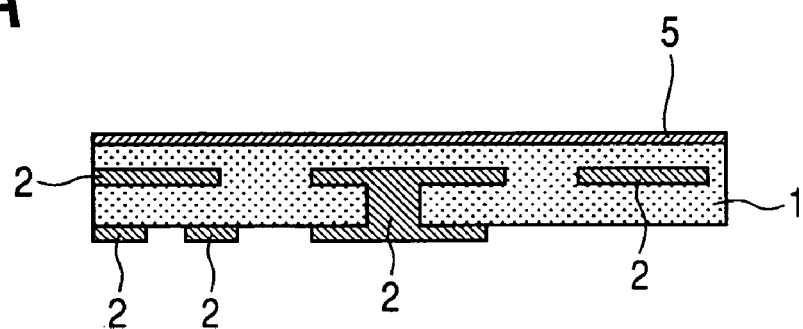
FIGS. 9A and 9B are process illustrations showing the procedure of forming an opening portion in an electronic part by the use of laser working.
Figure 9B:
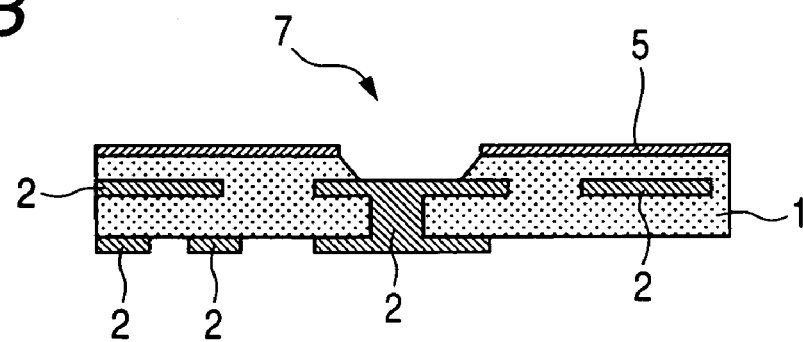
Figure 10A:
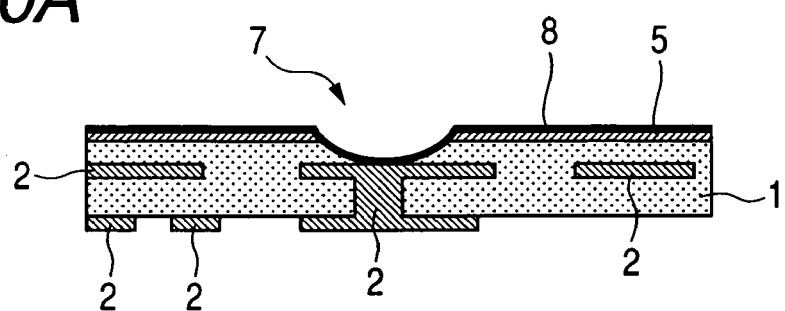
FIGS. 10A, 10B and 10C are process illustrations showing the procedure of forming a conductor portion in the opening portion of the electronic part.
Figure 10B:
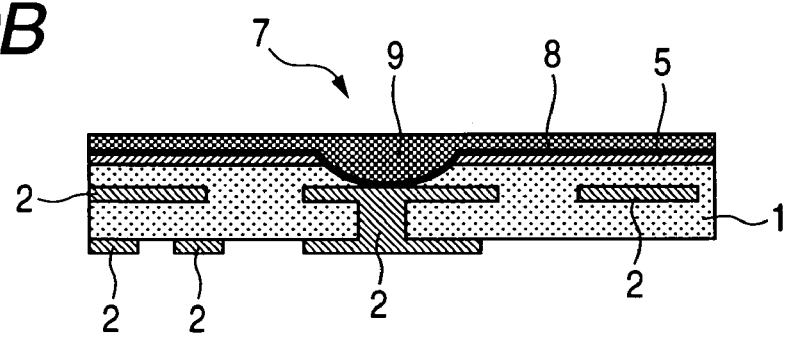
Figure 10C:
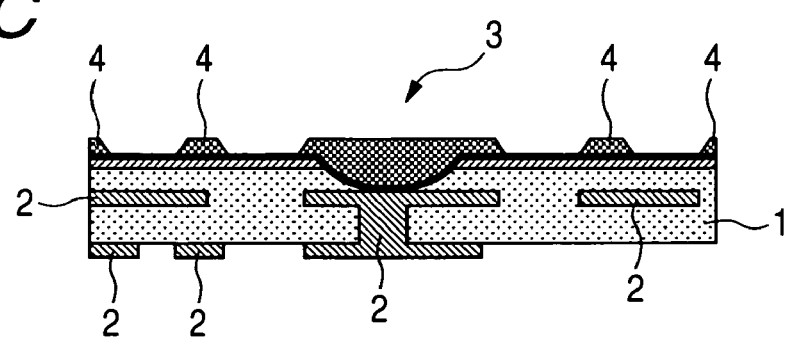

After the conductor portion 20 has been formed, as shown in FIG. 7E, patterning can be effected on the copper foil 14 by the subtractive method or the semi-additive process to thereby form upper layer wiring 30 from the copper foil 14.

While in the present embodiment, for the convenience of construction, use has been made of the lower layer wiring and the conductor portion overlying this lower layer wiring, this upper and lower positional relationship is not restrictive, but of course, a wiring layer manufactured by the above-described process and an electronic part using the same may be used in such a manner that the conductor portion (upper layer wiring side) is the lower side and the aforementioned lower layer wiring overlies the aforementioned conductor portion.

As has been described above, according to the present invention, in a method of manufacturing an electronic part in which on the upper surface of an insulating member covering lower layer wiring, a conductor portion connected from the lower layer wiring is exposed, electric power supplying film is formed on the upper surface of the insulating member, whereafter an opening portion having the lower layer wiring as a bottom is formed from the electric power supplying film side, metal plating is grown from the edge portion of the electric power supplying film from the opening portion with the electric power supplying film as an electrode, and the opening portion is filled with the metal plating closely contacting with the lower layer wiring to thereby provide it as a conductor portion and therefore, the electroless plating step (or other processing step replacing it) heretofore carried out can be eliminated and thus, the simplification of the manufacturing process can be achieved and also, such a problem as the metal catalyst being residual can be solved and therefore, it becomes possible to improve electrical reliability.

What is claimed is:

1. A method of manufacturing an electronic part in which on the upper surface of an insulating member covering lower layer wiring, a conductor portion connected from said lower layer wiring is exposed, comprising:

forming an electric power supplying film on the upper surface of said insulating member, and thereafter forming an opening portion having said lower layer wiring, which is insulated from said electric power supplying film, as a bottom from said electric power supplying film side, wherein an edge portion of said electric power supplying film is exposed on an inner wall surface of said opening portion, growing metal plating layer from only the edge portion of said electric power supplying film as an electrode, and filling said opening portion with the metal plating layer closely adhering with said lower layer wiring by depositing the metal plating layer so as to closely contact the lower layer wiring to thereby provide it as a conductor portion.

2. A method of manufacturing an electronic part in which on the upper surface of an insulating member covering lower layer wiring, a conductor portion connected from said lower layer wiring is exposed, comprising:

forming an electric power supplying film and protective film on the upper surface of said insulating member in a thickness direction, and thereafter forming an opening portion having said lower layer wiring, which is insulated from said electric power supplying film, as a bottom in said protective film and said electric power supplying film in the formed area of said conductor portion, wherein an edge portion of said electric power supplying film is exposed on an inner wall surface of said opening portion, growing metal plating layer from the edge portion of said electric power supplying film exposed as an electrode, and after said metal plating layer has reached said lower layer wiring, filling said opening portion with the metal plating layer closely adhering with said lower layer wiring, with said electric power supplying film and said lower layer wiring as electrodes, to thereby provide it as a conductor portion.

3. The method according to claim 1, wherein electric power supplying film and protective film are formed on the upper surface of said insulating member in a thickness direction, whereafter an opening portion is formed, and metal plating layer is grown from said electric power supplying film exposed from said opening portion.

4. The method according to claim 1, wherein the step of forming said electric power supplying film on said insulating member is performed by using said insulating member which is made into copper foil with insulating resin attached thereto.

5. The method according to claim 2, wherein the step of forming said electric power supplying film and protective film on said insulating member is performed by using said insulating member which is made into copper foil with insulating resin attached thereto.

* * * * *